United States Patent
Yun et al.

(10) Patent No.: US 10,254,591 B2
(45) Date of Patent: Apr. 9, 2019

(54) DISPLAY PANEL AND METHOD FOR MANUFACTURING THE SAME

(71) Applicant: SAMSUNG DISPLAY CO., LTD., Yongin-si, Gyeonggi-do (KR)

(72) Inventors: Sung Jae Yun, Hwaseong-si (KR); Jin Won Kim, Suwon-si (KR); Tae Min Kim, Hwaseong-si (KR); Taek Joon Lee, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/170,347

(22) Filed: Jun. 1, 2016

(65) Prior Publication Data
US 2017/0090227 A1    Mar. 30, 2017

(30) Foreign Application Priority Data

Sep. 30, 2015    (KR) .................. 10-2015-0137402

(51) Int. Cl.
| | |
|---|---|
| *G02F 1/1339* | (2006.01) |
| *G02F 1/1337* | (2006.01) |
| *G02F 1/1362* | (2006.01) |
| *G02F 1/1368* | (2006.01) |
| *H01L 27/12* | (2006.01) |
| *G02F 1/13* | (2006.01) |
| *G02F 1/1333* | (2006.01) |

(52) U.S. Cl.
CPC .......... *G02F 1/1339* (2013.01); *G02F 1/1303* (2013.01); *G02F 1/1337* (2013.01); *G02F 1/1368* (2013.01); *G02F 1/133351* (2013.01); *G02F 1/136286* (2013.01); *H01L 27/124* (2013.01); *H01L 27/1262* (2013.01); *G02F 2001/133354* (2013.01); *G02F 2001/133388* (2013.01); *G02F 2001/136222* (2013.01); *H01L 27/1214* (2013.01)

(58) Field of Classification Search
CPC ....... G02F 1/1339; G02F 2001/133354; G02F 2001/133388; G02F 2001/133391; G02F 2001/133374; G02F 1/1337; G02F 1/1368; G02F 1/1303; G02F 1/133351; G02F 1/136286; G02F 2001/136222; H01L 27/124; H01L 27/1262; H01L 27/1214
See application file for complete search history.

(56) References Cited

U.S. PATENT DOCUMENTS

| | | | |
|---|---|---|---|
| 8,304,039 B2 | 11/2012 | Oh et al. | |
| 2004/0263769 A1* | 12/2004 | Lee ...................... | G02F 1/1333 349/187 |

(Continued)

FOREIGN PATENT DOCUMENTS

| | | | |
|---|---|---|---|
| JP | 2001083521 A | * | 3/2001 |
| JP | 2008241992 A | * | 10/2008 |

(Continued)

*Primary Examiner* — Hoan C Nguyen
(74) *Attorney, Agent, or Firm* — Cantor Colburn LLP

(57) ABSTRACT

A display panel includes a first substrate, a second substrate disposed opposite to the first substrate, a first alignment key disposed on the first substrate; and a second alignment key disposed on the second substrate to overlap the first alignment key, where the second alignment key includes a border portion and a groove pattern disposed in a region defined by the border portion.

9 Claims, 21 Drawing Sheets

(56) References Cited

U.S. PATENT DOCUMENTS

| | | | | |
|---|---|---|---|---|
| 2006/0232728 A1* | 10/2006 | Kim | ................. | G02F 1/1333 |
| | | | | 349/106 |
| 2008/0150419 A1* | 6/2008 | Kang | ................. | H01L 51/524 |
| | | | | 313/504 |
| 2013/0153912 A1* | 6/2013 | Yoshida | ................. | H01L 23/544 |
| | | | | 257/59 |
| 2013/0222719 A1* | 8/2013 | Matsumoto | ......... | H04N 13/0409 |
| | | | | 349/15 |
| 2015/0362770 A1* | 12/2015 | Yang | ................. | G02F 1/133512 |
| | | | | 349/42 |

FOREIGN PATENT DOCUMENTS

| | | | |
|---|---|---|---|
| KR | 2006126159 | * | 12/2006 |
| KR | 1020090088340 A | | 8/2009 |
| KR | 1020140017767 A | | 2/2014 |
| KR | 1020150055643 A | | 5/2015 |

* cited by examiner

DISPLAY PANEL AND METHOD FOR MANUFACTURING THE SAME

This application claims priority to Korean Patent Application No. 10-2015-0137402, filed on Sep. 30, 2015, and all the benefits accruing therefrom under 35 U.S.C. § 119, the content of which in its entirety is herein incorporated by reference.

BACKGROUND

1. Field

The invention relates to a display panel, and more particularly to a display panel having a color filter-on-thin film transistor ("COT") structure.

2. Description of the Prior Art

A display device has been greatly developed with the growth of information communication technology, and has been widely used in the modern life. A liquid crystal display is one of the most widely used types of display device due to desired characteristics such as prominent picture quality, light weight, thin filming, and low driving voltage.

The liquid crystal display typically includes two substrates that face each other at a predetermined distance and liquid crystals interposed between the two substrates. In the liquid crystal display, light leakage may be prevented from occurring by providing a black matrix corresponding to a thin film transistor array. In a conventional liquid crystal display, a substrate, in which a color filter is provided, may be different from a substrate in which a thin film transistor is provided. Accordingly, in such a conventional liquid crystal display, alignment keys may be provided on the respective substrates for accurate alignment, and then the respective substrates are aligned and bonded to each other. However, in such a bonding process, misalignment may still occur between the black matrix, the thin film transistor and wirings to cause the light leakage to occur.

In order to prevent misalignment between the black matrix, the thin film transistor and wirings and to secure an aperture ratio of the liquid crystal display, a liquid crystal display having a color filter on thin film transistor ("COT") structure, in which a thin film transistor and a color filter are provided in a same substrate, has been developed. The liquid crystal display having the COT structure includes a first substrate, a second substrate facing the first substrate and including a thin film transistor, a color filter and a black matrix therein, and a liquid crystal layer interposed between the first substrate and the second substrate.

The liquid crystal display having the COT structure, when an alignment layer and a seal pattern come in contact with each other in a process of bonding the first substrate and the second substrate, seal coming-off inferiority may occur since a bonding force between the alignment layer and the seal pattern is weak. Further, rubbing directions of the alignment layers provided on the first substrate and the second substrate may be twisted, thereby deteriorating the contrast ratio.

As a result, although the COT structure may improve the aperture ratio through arrangement of the black matrix, the color filter and the thin film transistor on a same substrate, the black matrix may not be provided in the first substrate of the COT structure, but only transparent materials are arranged in the first substrate of the COT structure. Accordingly, it is desired to perform a process of manufacturing an alignment key for preventing such a misalignment.

SUMMARY

In a liquid crystal display having a color filter on thin film transistor ("COT") structure, where the black matrix is arranged in the substrate in which the color filter is arranged, it may not be possible to simultaneously form the alignment key with the same material as the black matrix, and thus discrimination of the alignment key for preventing the misalignment may be degraded to cause the alignment key to act as an undesired factor.

Accordingly, an embodiment of the invention is directed to a display panel, in which two substrates are bonded through an alignment key that includes a groove pattern and is formed on the substrate in which a black matrix is not arranged.

Another embodiment of the invention is directed to a method of manufacturing a display panel, which may easily provide an alignment key without any additional manufacturing process when the alignment key is provided on a substrate in which a black matrix is not arranged.

According to an embodiment of the invention, a display panel includes: a first substrate; a second substrate disposed opposite to the first substrate; a first alignment key disposed on the first substrate; and a second alignment key disposed on the second substrate to overlap the first alignment key, where the second alignment key includes a border portion and a groove pattern disposed in a region defined by the border portion.

In an embodiment, a display panel may further include a common electrode disposed on the second substrate, where the second alignment key may include a same material as a material of the common electrode on the second substrate.

In an embodiment, the second alignment key may be electrically connected to the common electrode.

In an embodiment, the first alignment key and the second alignment key may have different sizes from each other.

In an embodiment, the second alignment key may be disposed inside a region defined by the first alignment key in a way such that the border portion of the second alignment key is spaced apart from a border portion of the first alignment key.

In an embodiment, the second alignment key may be asymmetrically disposed in the first alignment key with respect to a center of the first alignment key.

According to another embodiment of the invention, a display panel includes a first substrate; a second substrate disposed opposite to the first substrate; a sealing key disposed on the second substrate; and a sealing member disposed between the first substrate and the second substrate to at least partly overlap the sealing key, where the sealing key includes a border portion and a groove pattern disposed in a region defined by the border portion.

In an embodiment, the groove pattern of the sealing key may include a first groove pattern extending in a first direction and a second groove pattern extending in a second direction which vertically crosses the first direction, and the sealing key may include a cross region on which the first groove pattern and the second groove pattern cross each other In an embodiment, a thickness of the first groove pattern may be different from a thickness of the second groove pattern.

In an embodiment, the groove patterns may include a tapered inner side wall.

In an embodiment, the groove patterns may include a curved boundary surface.

In an embodiment, the groove pattern may include a plurality of grooves, and a shortest width of an inside of a groove of the groove pattern may be shorter than a shortest gap distance between two adjacent grooves of the groove patterns.

In an embodiment, the sealing member may at least partly fill an inside of the groove pattern.

In an embodiment, the display panel may further include: a plurality of pixels disposed on a display region of the first substrate; a plurality of gate lines connected to the pixels; a plurality of data lines connected to the pixels and which crosses the gate lines; a first alignment disposed on an alignment key region of the first substrate, which is arranged on an outside of the sealing key; and a second alignment key disposed on the second substrate to overlap the first alignment key, where the sealing key is disposed on a non-display region of the first substrate, which is arranged on an outside of the display region to surround the display region.

In an embodiment, the first alignment key may include a same material as a material of the gate lines and the data lines and in a same layer as the gate lines and the data lines.

In an embodiment, a groove of the groove pattern of the second alignment key may include a bottom surface in the groove pattern and an inner side wall extending from the bottom surface to an upper surface of the groove pattern, and at least one of the bottom surface and the inner side wall may include an uneven surface.

According to another embodiment of the invention, a method for manufacturing a display panel includes: preparing a first substrate; depositing a transparent conductive material on the first substrate; providing a border region of a sealing key at a corner of the first substrate; irradiating laser into the broader region of the sealing key; and forming a groove pattern of the sealing key by moving the laser in a predetermined direction.

In an embodiment, the groove pattern of the sealing key may have a depth equal to or larger than about 15 micrometers (μm) from an upper surface of the transparent conductive material.

In such an embodiment, the laser may have a wavelength in a range of about 400 nanometers (nm) to about 600 nm.

In an embodiment, the method may further include: providing a first alignment key on the first substrate; preparing a second substrate; providing a second alignment key on the second substrate; and aligning the first substrate and the second substrate in a way such that the second alignment key of the second substrate is disposed an inside of the first alignment key of the first substrate.

In embodiment of a display panel according to the invention, the alignment key may be easily recognized, and thus time used for a bonding process of a display panel having a COT structure may be reduced.

According to another embodiment of the invention, a misalignment of substrates during a process of manufacturing a display panel may be effectively prevented.

The effects according to an embodiment of the invention are not limited to the contents as exemplified above, but further various effects are included in the description.

BRIEF DESCRIPTION OF THE DRAWINGS

The above and other features of the invention will be more apparent from the following detailed description taken in conjunction with the accompanying drawings, in which.

DETAILED DESCRIPTION

Figure 1:
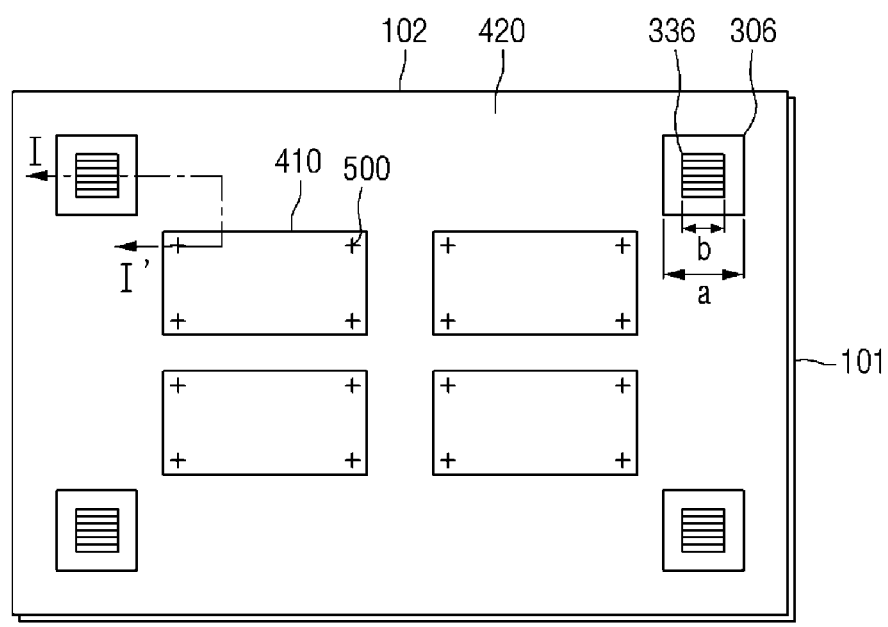
FIG. 1 is a plan view of a display panel according to an embodiment of the invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. "Or" means "and/or." As used herein, the term "and/or" includes any and all combinations of one or more of the associated listed items. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Hereinafter, embodiments of the invention will be described in detail with reference to the accompanying drawings.

FIG. 1 is a plan view of a display panel according to an embodiment of the invention.

Referring to FIG. 1, an embodiment of a display panel includes a first substrate 101 and a second substrate 102 disposed on the first substrate 101, e.g., on an upper surface of the first substrate 101, to face the first substrate 101. Herein, the display panel may be a display panel of a display device, or a mother display panel, which may be divided into a plurality of display panels through a cutting process.

The first substrate 101 and the second substrate 102 include substrate regions 410 and alignment key regions arranged between the substrate regions 410 to surround the substrate regions 410. First alignment keys 306 are arranged on the first substrate 101 in the alignment key regions. In one embodiment, for example, the first alignment keys 306 may be arranged at four corners of the first substrate 101, as shown in FIG. 1, but are not limited thereto. Alternatively, the first alignment keys 306 may be arranged at two corners that face each other in a diagonal direction on the display panel, or may be arranged at three corners.

Second alignment keys 336 are arranged opposite to the first alignment keys 306 on the first substrate 101. The second alignment key 336 has a size (e.g., a length b) that is smaller than a size (e.g., a length a) of the first alignment key 306. The second alignment key 336 has an area that is smaller than the area of the first alignment key 306. In such an embodiment, the second alignment key 336 is disposed in the first alignment key 306 in a way such that a border portion of the second alignment key 336 is spaced apart from a border portion of the first alignment key 306. Accordingly, a region defined by the border portion of the first alignment key 306 may include a portion that overlaps the second alignment key 336 and a portion that does not overlap the second alignment key 336 when viewed from a plan view in a thickness direction. The first alignment key 306 may be defined only by the border portion, and the second alignment key 336 may include the border portion and a groove pattern disposed in the border portion.

Sealing keys 500 may be arranged in the substrate regions 410. The sealing keys 500 may be arranged for the respective substrate regions 410 on the second substrate 102. The sealing keys 500 may be arranged on a non-display region of the substrate region 410, and a sealing member may be arranged on a lower portion of the second substrate 102 on which the sealing keys 500 are arranged.

Figure 2:
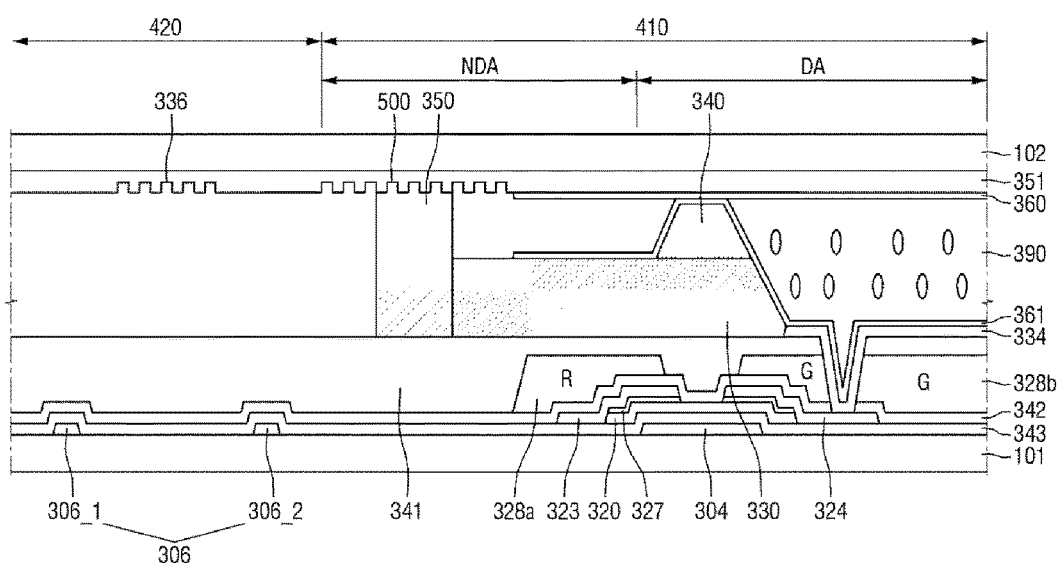
FIG. 2 is a cross-sectional view taken along line I-I' of FIG. 1.

FIG. 2 is a cross-sectional view taken along line I-I' of FIG. 1. Referring to FIG. 2, an embodiment of the display panel includes the first substrate 101, the second substrate 102 that is opposite to the first substrate 101, and a liquid crystal layer 390 interposed between the first substrate 101 and the second substrate 102. The sealing keys 500 are arranged on the substrate region 410 of the display panel, and the first alignment key 306 and the second alignment key 336 are arranged on the alignment key region 420.

The substrate region 410 includes a display region DA and a non-display region NDA. The display region DA is a region on which an image is visually recognized, and the non-display region NDA is a region on which the image is not visually recognized. The display region DA may be surrounded by the non-display region NDA.

A common electrode 351 is arranged on the second substrate 102. The common electrode 351 may be arranged on an inner surface of the second substrate 102, which a surface facing the first substrate 101, in the form of a plate. A common voltage may be applied to the common electrode 351 on the second substrate 102.

The common electrode 351 may extend to the alignment key region 420 of the display panel. The common electrode 351 may include the second alignment key 336 including a groove pattern defined on a portion of the alignment key region 420. A plurality of groove patterns may be arranged at predetermined intervals, and the common electrode 351 may be arranged between the groove patterns. The groove pattern may defined by a portion of the common electrode 351 that is recessed toward the second substrate 102.

The common electrode 351 may include the sealing keys 500 including the groove patterns that are formed on one portion of the non-display region NDA in the substrate region 410. The plurality of groove patterns may be arranged at predetermined intervals, and the sealing keys 500 may be in the form in which grooves are arranged on the common electrode 351. An upper alignment layer 360 may be disposed on the common electrode 351 in the substrate regions 410 of the second substrate 102.

The first substrate 101 may be a base substrate of a thin film transistor substrate. On the display region DA of the first substrate 101, a plurality of gate lines extending in a first direction and a plurality of data lines extending in a second direction that is perpendicular to the first direction may be disposed on the first substrate 101. A pixel electrode 334 may be arranged on the first substrate 101 for each pixel region that may be defined by a corresponding gate line and a corresponding data line, but not being limited thereto. Herein, the first direction may be a horizontal direction and the second direction may be a vertical direction, but are not limited thereto.

The gate electrode 304 may project from a gate line toward the pixel electrode 334. The gate electrode 304 may be arranged on the first substrate 101. The first alignment key 306 may be arranged in a same layer as the gate electrode 304 and the gate line. The first alignment key 306 has a space that is defined by border portions 306_1 and 306_2. The border portions 306_1 and 306_2 of the first alignment key 306 may include or be made of a same material as the gate electrode 304 and be directly on a same layer (e.g., the first substrate 101) as the gate electrode 304.

The first substrate 101 may be a base substrate including or made of glass or polymer, and the gate electrode 304, a gate insulating layer 343, a semiconductor layer 320, an ohmic contact layer 327, a source electrode 323, a drain electrode 324, a passivation layer 342 and an organic layer 341 are disposed, e.g., sequentially, on the first substrate 101.

A channel of the thin film transistor may be formed by the semiconductor layer 320. The semiconductor layer 320 may be arranged to overlap the gate electrode 304. The source electrode 323 and the drain electrode 324 may be spaced apart from each other on the basis of the semiconductor layer 320.

The pixel electrode 324 may be arranged for each unit pixel on the organic layer 341. A part of the pixel electrode 324 is arranged inside a contact hole. A part of the pixel electrode 324 that is arranged inside the contact hole may come in contact with the drain electrode 324 to be electrically connected thereto. The pixel electrode 324 receives a data voltage that is applied from the drain electrode 324 and controls the direction of the liquid crystal molecules together with the common electrode 351.

On the display region DA of the first substrate 101, color filters 328a and 328b may be arranged for each pixel. The respective color filters 328a and 328b may be arranged between the passivation layer 342 and the organic layer 341, which cover the source electrode 323 and the drain electrode 324. The color filters 328a and 328b may include red (R), green (G), and blue (B) color filters. The red (R), green (G), and blue (B) color filters 328a and 328b may be alternately arranged along respective rows and columns for a plurality of pixels arranged in a matrix form.

A light blocking pattern 330 may be arranged on a boundary of the respective color filters 328a and 328b. The light blocking pattern 330 may be arranged on an upper portion of the organic layer 341, and the light blocking pattern 330 may be arranged not only on the boundary of the color filters 328a and 328b but also on a part of the non-display region NDA. The light blocking pattern 330 may extend to a portion on which a sealing member 350 is arranged, and may be arranged on the non-display region NDA.

A column spacer 340 may be arranged on the light blocking pattern 330. The light blocking pattern 330 and the column spacer 340 may be integrally formed as a single unitary and indivisible unit. The column spacer 340 may maintain a cell gap between the first substrate 101 and the second substrate 102.

The first substrate 101 and the second substrate 102 may be bonded together by the sealing member 350 including a sealant or the like. The sealing member 350 may be arranged on the non-display regions NDA of the first substrate 101 and the second substrate 102. The sealing member 350 may seal up the liquid crystal layer 390 to allow the liquid crystal layer 390 to stay in the display panel. The sealing member 350 may be arranged to fill at least a part of an inside of the groove of the sealing key 500 arranged on the common electrode 351 of the second substrate 102.

Hereinafter, referring to FIG. 3, an embodiment of a manufacturing method for forming the second alignment keys 336 on the second substrate 102 will be described.

Figure 3:
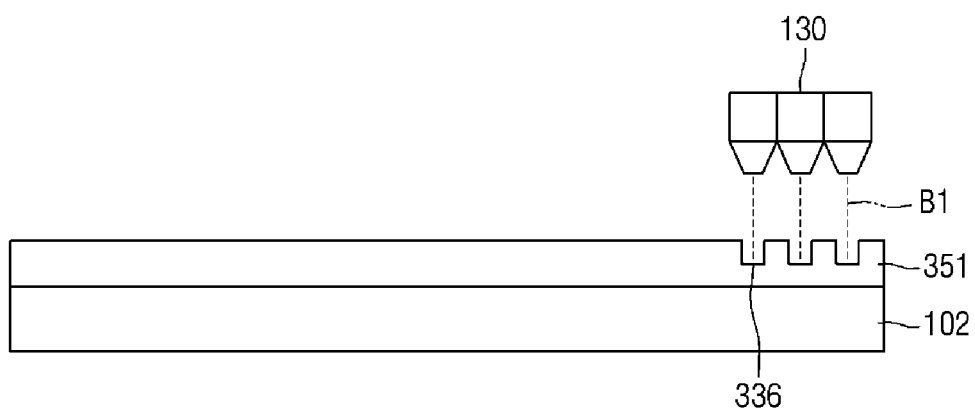
FIG. 3 is a cross-sectional view showing a method for manufacturing a second alignment key according to an embodiment of the invention.

FIG. 3 is a cross-sectional view showing a method for manufacturing a second alignment key according to an embodiment of the invention. First, the second substrate 102 is prepared. The second substrate 102 may include an insulating material, such as transparent glass, quartz, ceramic, silicon, or transparent plastic. The second substrate 102 may be in the form of a rectangular plate.

A material for forming the common electrode 351 may be provided or formed on the second substrate 102 by sputtering the material on a surface, e.g., an upper surface, of the second substrate 102. Thereafter, a border is defined on a position, on which the second alignment keys 336 are to be arranged, and then the groove pattern may be formed in the border using a laser device 130. In such an embodiment, green series laser B1 having a wavelength band of about 400 nanometers (nm) to about 600 nm and the irradiation energy in a range of about 1 millijoule (mJ) to about 10 mJ may be used to form the second alignment keys 336.

The laser device 130 may irradiate the laser B1 from an upper portion of a surface, on which the common electrode 351 of the second substrate 102 is arranged, toward the second substrate 102 to remove or cut a part of the common electrode 351. Accordingly, the groove pattern, defined by a recessed part of the common electrode 351 toward the second substrate 102, is formed to provide the second alignment keys 336.

Figure 4:
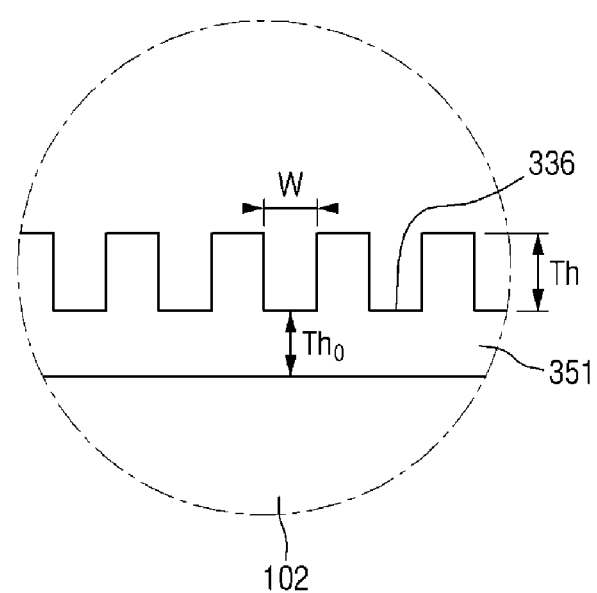
FIGS. 4 to 7 are enlarged views of a groove pattern of a second alignment key according to some embodiments of the invention.

FIG. 4 is an enlarged view of the second alignment keys 336 formed by the method shown in FIG. 3. Referring to FIG. 4, the thickness (Th+Th$_0$) of the common electrode 351 before the second alignment keys 336 are formed may be in a range of about 30 micrometers (μm) to about 40 μm. The depth Th of the groove pattern of the second alignment keys 336 may be equal to or larger than about 13 μm. In one embodiment, for example, the depth Th of the groove pattern of the second alignment keys 336 may be equal to or larger than about 25 μm and equal to or smaller than about 30 μm. The width W of the groove pattern may be smaller than about 5 μm. A plurality of groove patterns may be formed in the second alignment keys 336, and, the laser device 103 may output a plurality of lasers sequentially or simultaneously to form the plurality of groove patterns.

Figure 5:
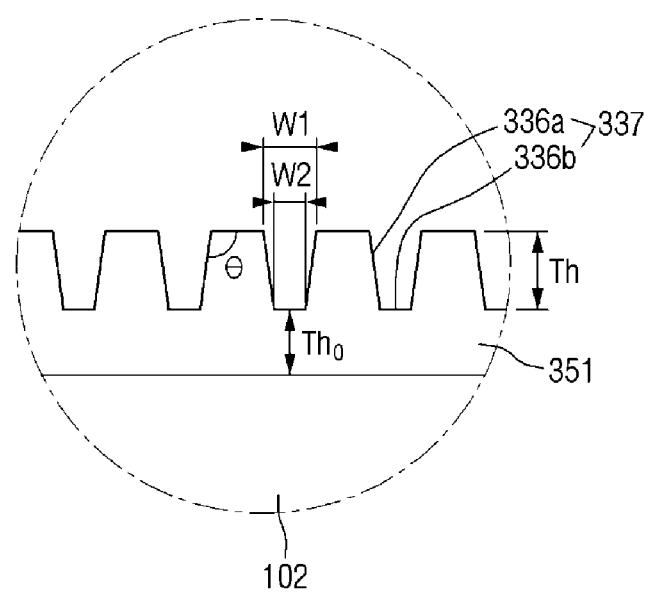

FIG. 5 is an enlarged view of the second alignment keys 337 formed on the second substrate 102 according to an alternative embodiment of the invention.

Referring to FIG. 3, the second alignment keys 337 as shown in FIG. 5 may be formed by temporally controlling the wavelength of the output laser of the laser device 130 or energy of the laser. The groove pattern of the second alignment key 337 includes a bottom portion 337b and an inner side wall 336a that extends from the bottom portion 336b to the upper side. The inner side wall 336a may include a side wall that is tapered from the bottom portion 336b, and thus the width W1 of an inlet of the groove pattern may be wider than the width W2 of the bottom portion 336B. In such an embodiment, the second alignment key 337 may have a tapered groove pattern.

Figure 6:
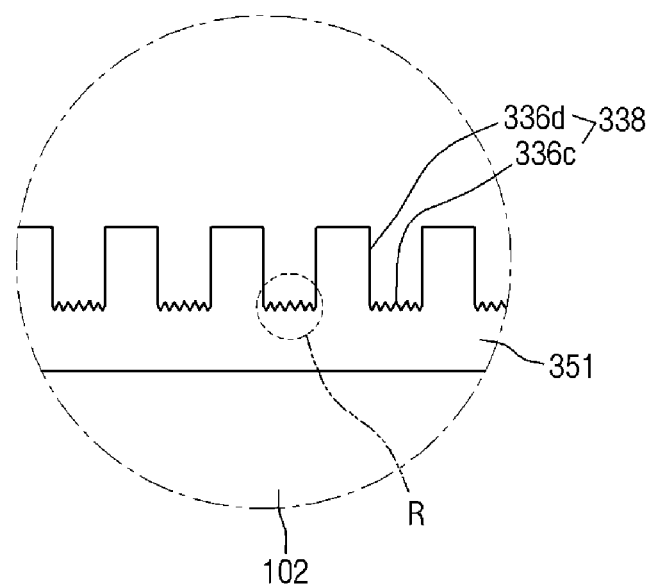

FIG. 6 is an enlarged view of a second alignment key 338. The second alignment key 338 may include a bottom portion 336c and an inner side wall 336d that extends from the bottom portion 336c to the upper side. A surface of the bottom portion 336c may further include an uneven portion R. The uneven portion R may be provided or formed in the irradiation process of the laser B1 of the laser device 130. The uneven portion R may be an irregular surface, and may be irregularly provided. In one embodiment, for example, the uneven portion R may be provided only a portion of the surface of the bottom portion 336c.

Figure 7:
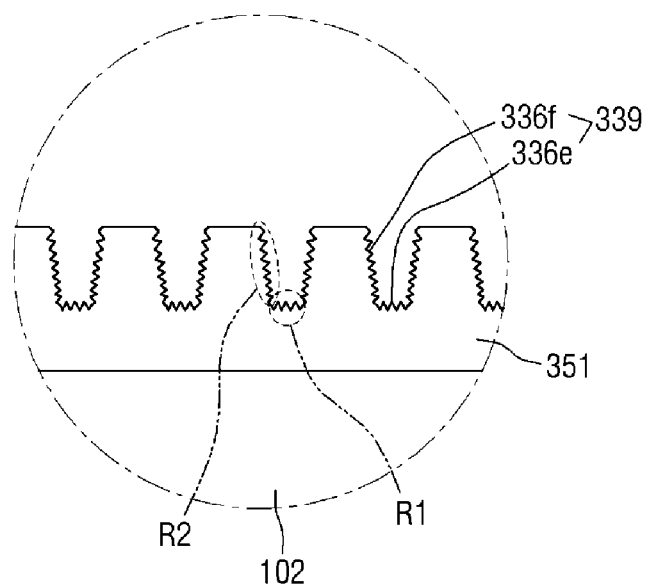

FIG. 7 is an enlarged view of a second alignment key 339 according to another alternative embodiment of the invention. The second alignment key 339 may include a bottom portion 336e and an inner side wall 336f that extends from the bottom portion 336e to the upper side. At least parts of the bottom portion 336e and the inner side wall 336f may include uneven surfaces R1 and R2. The uneven surfaces R1 and R2 may be provided due to fragments that are generated when the common electrode 351 is cut in the irradiation process of the laser B1 of the laser device 130. Accordingly, the respective uneven surfaces R1 and R2 may have different uneven angles, uneven depths, and uneven patterns.

Embodiments of the alignment key 336 to 339 in FIGS. 5 to 7 are applicable to the sealing keys 500. In an embodiment, the groove pattern of the sealing key 500 may include a first groove pattern extending in the first direction and a second groove pattern extending in the second direction that is perpendicular to the first direction, and may have a structure the same as those of the embodiments of the alignment key 336 to 339 in FIGS. 5 to 7, where each of the groove patterns may include a bottom portion and an inner side wall that extends from the bottom portion to the upper side. At least a part of the bottom portion or the inner side wall may include uneven surfaces R1 and R2, and the inner side wall may include an inclined surface that is tapered from the bottom portion. In an embodiment of the invention, the alignment keys 336 and the sealing keys 500 of the second substrate may be provided or formed by a same manufacturing method, and thus it will be apparent to those skilled in the art that the embodiments of the alignment key 336 to 339 may be applied to the sealing keys 500.

Figure 8:
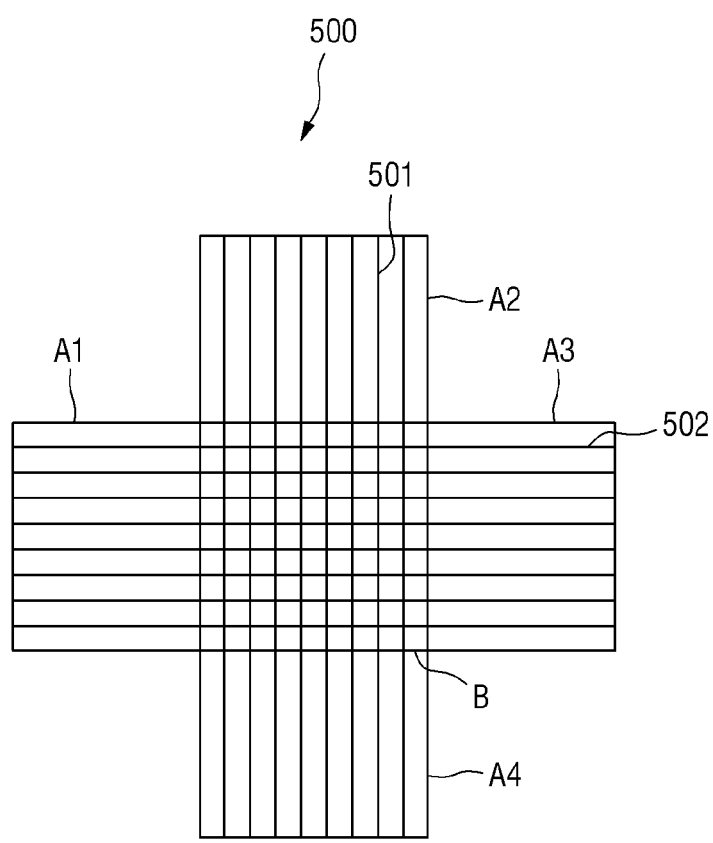
FIG. 8 is an enlarged view of a sealing key according to an embodiment of the invention.

FIG. 8 is an enlarged view of a sealing key 500 according to an embodiment of the invention.

Referring to FIG. 8, an embodiment of the sealing key 500 may be in a cross (+) shape. Accordingly, the sealing key 500 may be divided into a first region A1, a second region A2, a third region A3, a fourth region A4 and a cross region B. The sealing member 500 may be spread along the fourth region A4, the cross region B and the third region A3. Accordingly, the sealing member 350 may overlap the sealing key 500.

The sealing key 500 includes grooves 501 and 502 in a cross-shaped border portion, that is, the first groove 501 that extends in the first direction and the second groove 502 that extends in the second direction that is perpendicular to the first direction.

The first groove 501 may extend from the second region A2 to the fourth region A4, and the second groove 502 may extend from the first region A1 to the third region A3. The cross region B may include both the first groove 501 and the second groove 502.

Figure 9A:
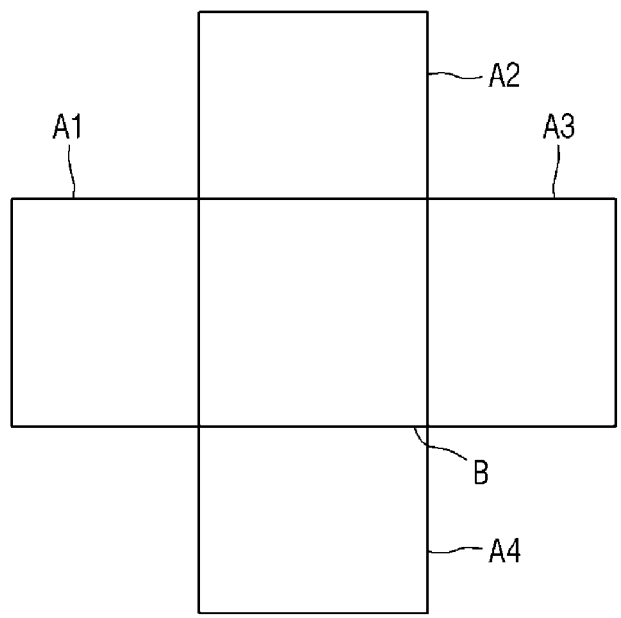
FIGS. 9A to 9C are views showing a method for manufacturing a sealing key according to an embodiment of the invention.
Figure 9B:
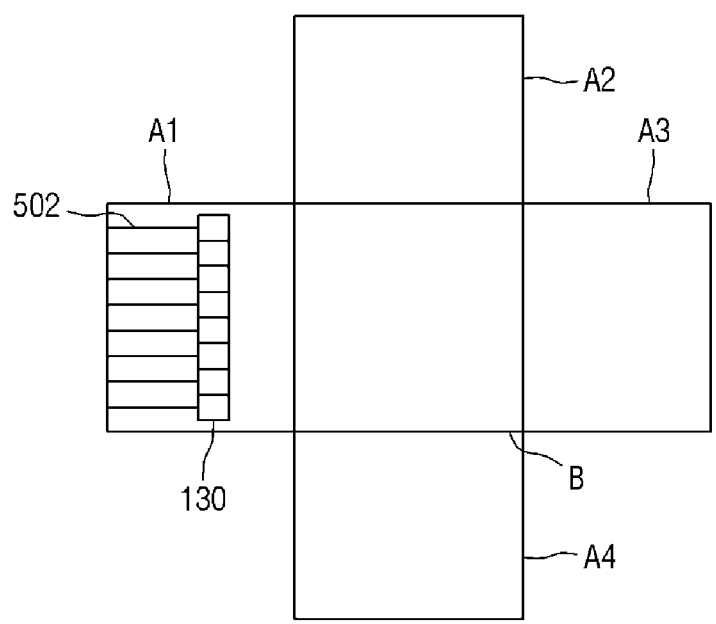
Figure 9C:
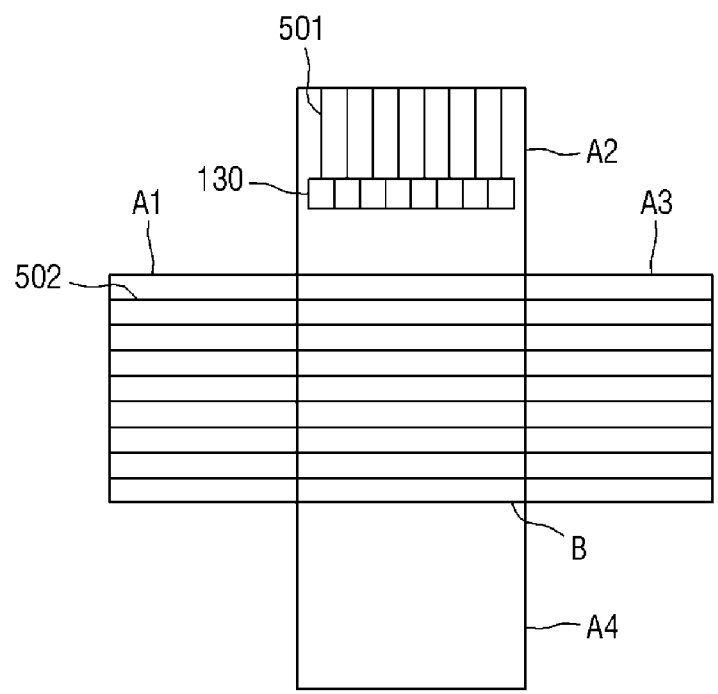

Referring to FIGS. 9A to 9C, an embodiment of a method for manufacturing a sealing key 500 will be described in detail. Referring to FIG. 9A, a border portion of the sealing key 500 is formed. The border portion may be formed through arrangement of the laser device 130 on a sealing key forming region of the common electrode 351 of the second substrate 102.

Referring to FIG. 9B, the second groove 502 may be formed through arrangement of the laser device 130 on a side of the first region A1 of the common electrode 351. The second groove 502 may be formed from a side of the first region A1 to the end of the third region A3.

Referring to FIG. 9C, the first groove 501 may be formed through arrangement of the laser device 130 on a side of the second region A2 of the common electrode 351. The first groove 501 may be formed from one side of the second region A2 to the end of the fourth region A4.

Figure 10:
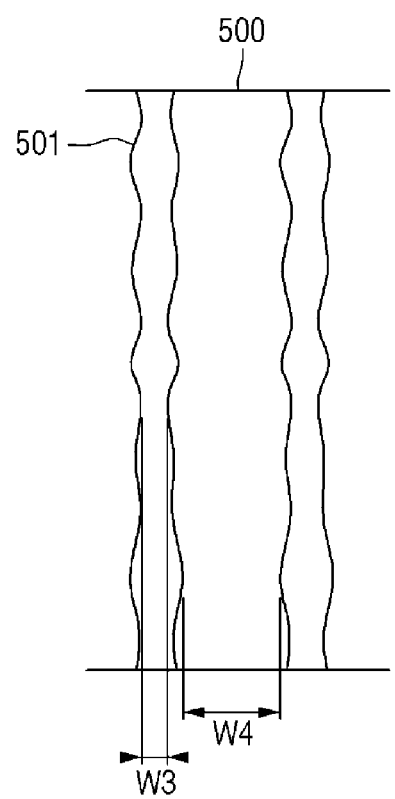
FIG. 10 is an enlarged view of a groove of a sealing key.

FIG. 10 is an enlarged view of the first groove 501. As shown in FIG. 10, the first groove 501 arranged on the sealing key 500 may have a finely curved surface. The sealing key 500 may have a gap distance by the first groove 501. When the sealing key 500 has the shortest width W3 by the curved surface of the first groove 501, the shortest gap distance W4 between the first groove 501 and an adjacent first groove 501 may be wider than the shortest gap distance W3 by the curved surface of the first groove 501.

Figure 11:
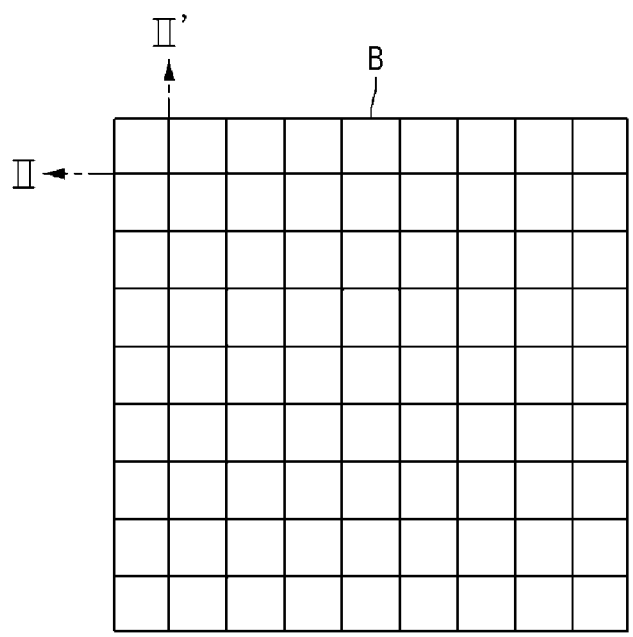
FIG. 11 is an enlarged view separately illustrating a cross region of a sealing key.
Figure 12:
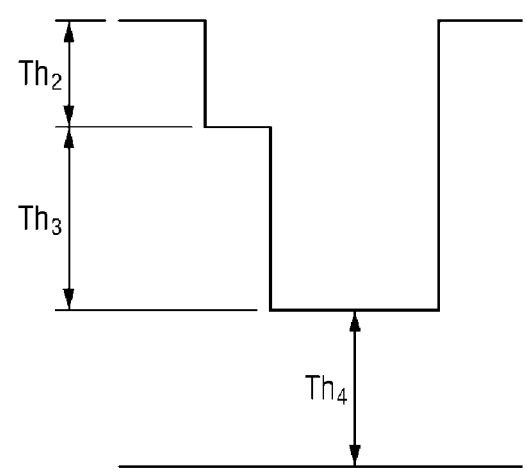
FIG. 12 is a cross-sectional view taken along line II-II' of FIG. 11.

FIG. 11 is an enlarged view illustrating a cross region B of a sealing key 500, and FIG. 12 is a cross-sectional view taken along line II-II' of FIG. 11.

Referring to FIGS. 11 and 12, the cross region B may include both the first groove 501 and the second groove 502, and the first groove 501 and the second groove 502 may vertically cross each other. As shown in FIGS. 9A to 9C, in an embodiment where the first groove 501 is formed after forming the second groove 502, the thickness (Th2+Th3) of the first groove 501 may be larger than the thickness Th2 of the second groove 502. A groove formed layer is deeper as the laser B1 directly reaches a deeper portion when the same energy is applied.

Figure 13A:
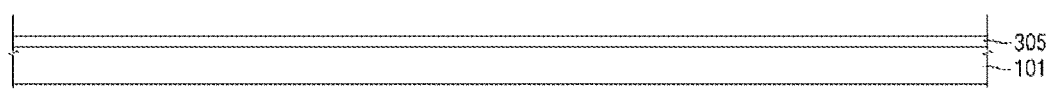
FIGS. 13A to 13F are views showing a method for manufacturing a first alignment key according to an embodiment of the invention.

In an embodiment, as illustrated in FIG. 13A, a conductive material 305 may be sputtered on a surface of the first substrate 101. In such an embodiment, a low-resistance opaque conductive material, such as aluminum, an aluminum alloy, tungsten, copper, chrome, molybdenum, or a molybdenum alloy, may be used as the conductive material 305.

Figure 13B:
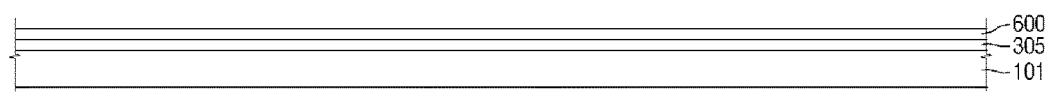

In such an embodiment, as illustrated in FIG. 13B, a photoresist layer 600 is provided or formed on the layer of the conductive material 305. The photoresist layer 600 may be partially cured through irradiation of ultraviolet rays 605. Since the cured region is not removed in a development stage, the conductive material that is formed on the lower portion thereof can be protected.

Figure 13C:
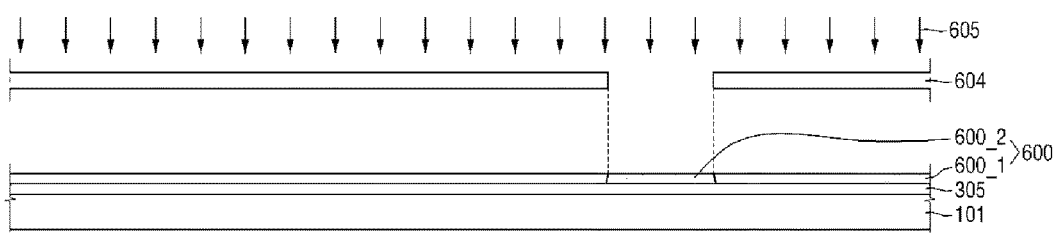

In such an embodiment, as illustrated in FIG. 13C, the ultraviolet rays 605 are irradiated on the upper portion of the photoresist layer 600_2 that is on the upper portion of a position on which the gate electrode 304 and the first alignment key 306 are to be formed. In such an embodiment, a mask 604 may be used to transmit the ultraviolet rays to a partial region only and to intercept the ultraviolet rays 605 with respect to the other region. Partial regions 600_2, 600_3 and 600_4 of the photoresist layer, onto which the ultraviolet rays 605 are irradiated, may be cured.

Figure 13D:

In such an embodiment, as illustrated in FIG. 13D, a development process for removing the remaining region except for the cured photoresist layers 600_2, 600_3 and 600_4 may be performed.

Figure 13E:
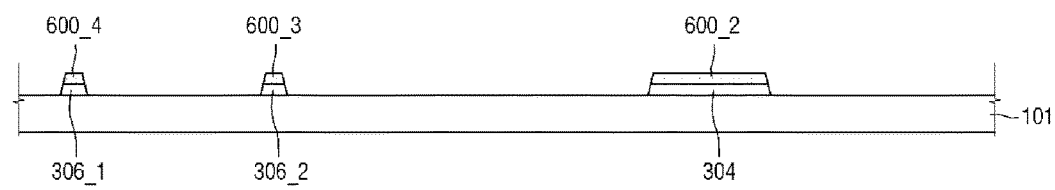

In such an embodiment, as illustrated in FIG. 13E, an etching process for removing the conductive material on the region except for the remaining cured photoresist layer may be performed.

Figure 13F:
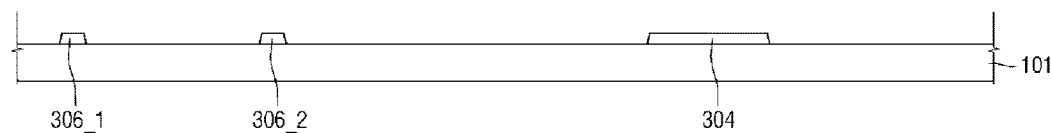

In such an embodiment, as illustrated in FIG. 13F, by removing the remaining cured photoresist, the gate line, the gate electrode 304, and the first alignment key 306 may be formed on the first substrate 101 in predetermined or desired shapes.

Figure 14:
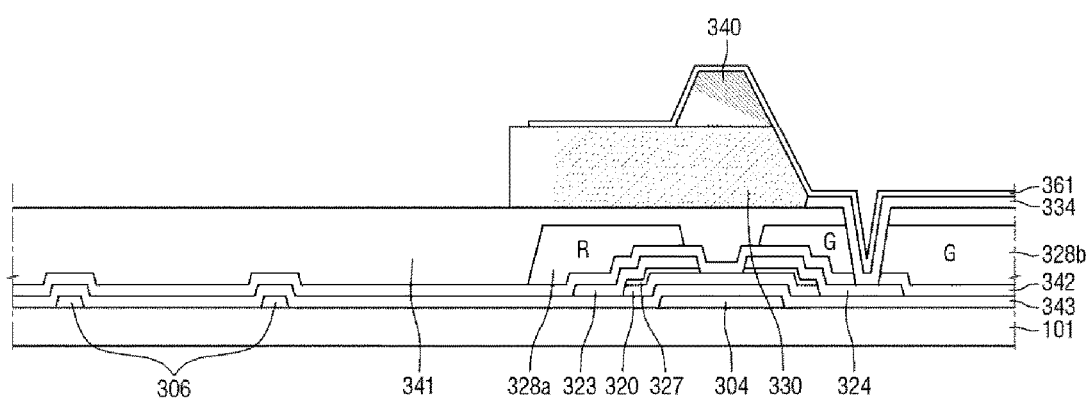
FIG. 14 is a cross-sectional view of an embodiment of a first substrate manufactured through the method shown in FIGS. 13A to 13F.

FIG. 14 is a cross-sectional view of an embodiment of a first substrate manufactured through the method shown in FIGS. 13A to 13F. FIG. 14 shows the cross section of an embodiment of the first substrate 101 that is completed through processes of providing the gate line, the gate electrode 304 and the first alignment key 306 as illustrated in FIGS. 13A to 13F.

The gate insulating layer 343, the semiconductor layer 320, the source electrode 323, the drain electrode 324 and the passivation layer 342 may be provided, e.g., sequentially deposited, on the first substrate 101. The processes for providing the gate insulating layer 343, the semiconductor layer 320, the source electrode 323, the drain electrode 324 and the passivation layer 342 are well known to those skilled in the art, and any detailed description thereof will be omitted. After the organic layer 341 and the color filters 328a and 328b are provided, the contact hole is formed to form the pixel electrode 334. Thereafter, the light blocking pattern 330 and the column spacer 340 may be integrally formed to overlap the region on which the thin film transistor is arranged, the data line, or the gate line. Then, a lower alignment layer 361 is disposed thereon to manufacture the thin film transistor substrate including the first substrate 101.

Diverse shapes of the second alignment key 336 and the first alignment key 306 of the first substrate 101, which are manufactured in the above-described method, will be described with reference to FIG. 15.

Figure 15:
FIG. 15 is a view illustrating the shapes of a first alignment key and a second alignment key according to some embodiments of the invention.

Referring to FIG. 15, in an embodiment, the second alignment key 336 arranged on the first substrate 101 may be in a small square shape, and the first alignment key 306 may be in a large square shape that is larger than the small square of the second alignment key 336.

In an alternative embodiment, the first alignment key 306 that is arranged on the first substrate 101 may be in a cross shape, and the second alignment key 336 on the second substrate 102 may be formed along four corners of the first alignment key 306. In a bonded state, the second alignment key 336 may be shaped to be put in the first alignment key 306. In such an embodiment, time required to form the second alignment key 336 by the laser can be reduced in comparison to the above-described embodiment.

In another alternative embodiment, the second alignment key 336 arranged on the second substrate 102 may be in a small circular shape. In such an embodiment, the second alignment key 336 may be in a circular shape, and the first alignment key 306 may be in a circular shape that is larger than the circular shape of the second alignment key 336. The second alignment key 336 may further include a groove pattern. In such an embodiment, the alignment key may be designed through accurately calculating an error allowance range when the first substrate 101 and the second mother substrate are aligned in comparison to other embodiments as the distances for which the alignment key is apart from the center are the same.

Figure 16:
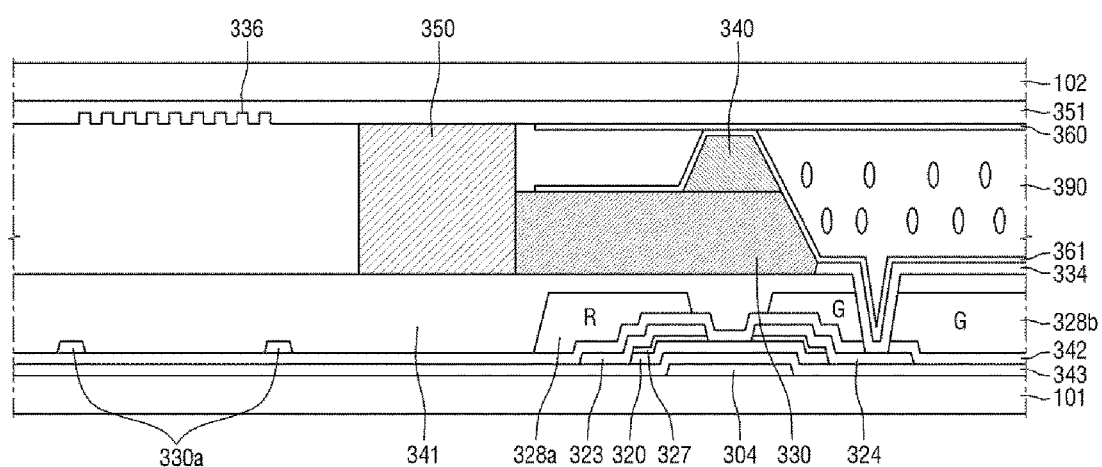
FIG. 16 is a cross-sectional view of a display panel according to alternative embodiments of the invention.

FIG. 16 is a cross-sectional view of a display panel according to alternative embodiments of the invention. FIG. 16 illustrates that the first alignment key 306 may be manufacture by a same process as the light blocking pattern 330 with the same material as the light blocking pattern 330.

Referring to FIG. 16, the first alignment key 306 may be arranged on the organic layer 341, and may be formed together when the light blocking pattern 330 is formed. The light blocking pattern 330 may include or be made of a black series organic dye, and thus it will be apparent to those skilled in the art that the light blocking pattern 330 may be manufactured in a similar method to the above-described manufacturing method.

Figure 17:
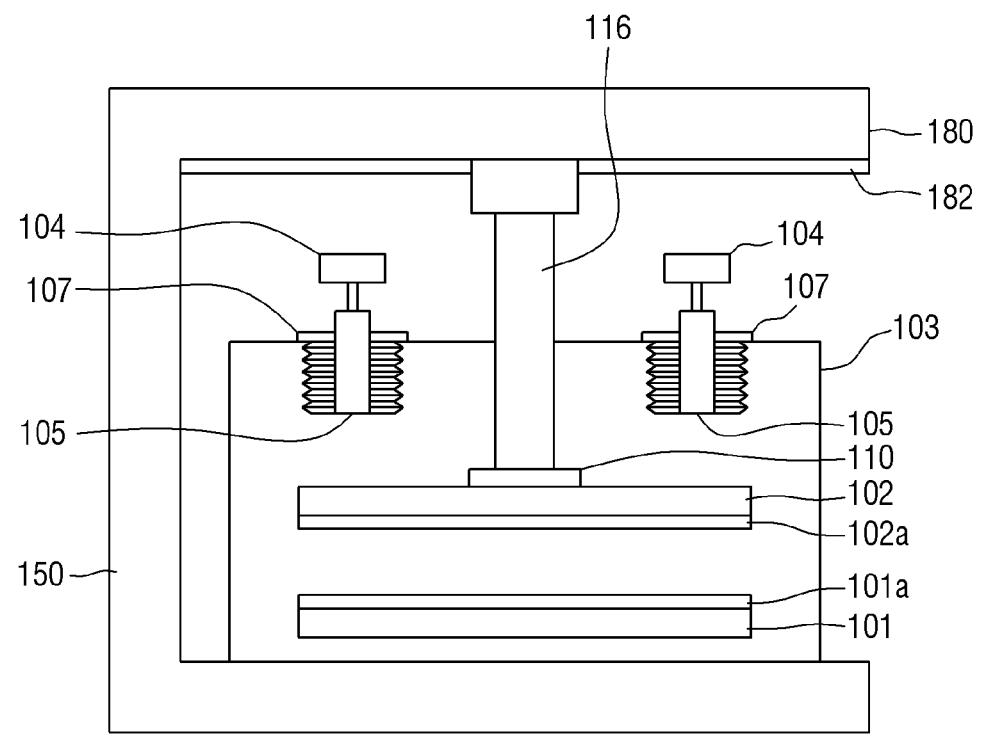
FIG. 17 is a cross-sectional of a bonding device for bonding a display panel according to some embodiments of the invention.

FIG. 17 is a cross-sectional of a bonding device for bonding a display panel according to an embodiment of the invention.

As illustrated in FIG. 10, a bonding device of the liquid crystal display includes a vacuum chamber 103 that is isolated from an outside to keep a vacuum state therein to prevent inflow of foreign substances, such as impurities, when the second substrate 102 and the first substrate 101 are bonded; a detector 104 configured to align the second substrate 102 and the first substrate 101 through sensing of bonding marks of the two substrates 101 and 102 on the vacuum chamber 103; a bellows pipe 105 configured to move upward/downward in the vacuum chamber 103 together with the detector 104; a pickup 110 configured to move the second substrate 102; a bar 180 configured to support the pickup 110; a rail 182 arranged below the bar; a moving motor 116 configured to move along the rail 182; and a support portion 150 configured to fix the bar 180.

After the second substrate 102 and the first substrate 101 are entered, the vacuum chamber 103 maintains a vacuum state therein. In such an embodiment, the degree of vacuum in the vacuum chamber 103 may be controlled based on a liquid crystal mode to be bonded, and for example, in an in-plane switching ("IPS") mode, the degree of vacuum may be about $1.0 \times 10^{-3}$ pascal (Pa) to about 1 Pa, while in a twisted nematic ("TN") mode, the degree of vacuum may be about $1.1 \times 10^{-3}$ Pa to about 102 Pa.

The vacuum chamber 103 includes an inner space having a size determined to accommodate the second substrate 102 and the first substrate 101. The bottom surface of the vacuum chamber 103 may be constructed to adsorb the front surface of the first substrate 101 to fix the first substrate 101. Accordingly, the first substrate 101 may be fixed in the vacuum chamber 103 without movement. The pickup 110 is connected up to the bar 108 through a groove formed on an upper portion of the vacuum chamber 103, and moves in all directions in the vacuum chamber 103 in a state where the pickup 110 attaches the second substrate 102 thereto. In such an embodiment, the degree of vacuum of the pickup 110 is higher than the degree of vacuum of the inner space of the vacuum chamber 103.

The pickup 110 may be designed to move in all directions and to be rotated by 360°. After the pickup 110 is attached to the second substrate 102, the detector 104 senses the second alignment mark of the second substrate 102 and the first alignment mark of the first substrate 101 to match the positions thereof, and the pickup 110 makes the second substrate 102 descend in a vertical direction so that the second substrate 102 faces the first substrate 101. The pickup 110 may make the second substrate 102 vertically descend until the gap between the second substrate 102 and the first substrate 101 becomes about 1 millimeter (mm). When the gap between the second substrate 102 and the first substrate 101 becomes about 1 mm, the detector 104 recognizes the respective alignment marks of the second substrate 102 and the first substrate 101 once again, and makes the second substrate 102 vertically descend once again if it is determined that the respective positions of the second substrate 102 and the first substrate 101 are aligned. In such an embodiment, the pickup 110 recognizes that the upper surface 102a of the second substrate 102 comes in contact with the upper surface 101a of the first substrate 101, and bonds the two substrates 101 and 102 with pressure in a range of about 0.1 ton to about 0.5 ton from the contact point.

If the bonding of the two substrates 101 and 102 is completed through pressing, the bonded substrates 101 and 102 are separated from the pickup 110, and the vacuum adsorption state of the first substrate 101 that is fixed in the vacuum chamber 103 is released through unloading.

The detector 104 may be arranged on at least two corner portions of the second substrate 102 of a rectangular plate shape that is arranged in the vacuum chamber 103. In such an embodiment where two detectors 104 are installed, the detectors 104 may be arranged at opposite positions in a diagonal direction on the plane of the second substrate 102. The detectors 104 may be arranged at four corners of the second substrate 102, or may be arranged at three corners of the second substrate 102.

The detector 104 has a structure that is similar to the structure of a microscope. The detector 104 recognizes a bonding mark of the second substrate 102 and a bonding mark of the first substrate 101, and then determines whether the two substrates 101 and 102 are aligned based on the arrangement state of the alignment marks of the two substrates. The detector 104 may be arranged at a fixed position in the vacuum chamber 103. If it is determined that the arrangement positions of the second substrate 102 and the first substrate 101 are not effectively aligned, the detector 104 make the pickup 110 move the second substrate 102 in the vacuum chamber 103. The detector 104 determines whether the second substrate 102 and the first substrate 101 are aligned based on the detected arrangement state of the second alignment mark of the second substrate 102 and the first alignment mark of the first substrate 101 even while the second substrate 102 is moved, and if it is determined that the two substrates are aligned, the detector 104 may stop the movement of the pickup 110.

The bellows pipe 107 enables the detector 104 to move in a vertical direction from an upper portion of the second substrate 102 in the vacuum chamber 103. If the second substrate 102 descends in the vertical direction in a state where the detector 104 is fixed, the focal distance between the detector 104 and the bonding mark of the second substrate 102 may be lengthened to deteriorate resolution. In such an embodiment, in the COT structure, since the second substrate 102 and elements thereon may be made of only a transparent material and the second alignment mark of the second substrate 102 may not be easily recognized in a state where the second substrate 102 floats in the air, it may be desired to increase the resolution. Accordingly, when the second substrate 102 descends in the vertical direction, it is desired for the detector 104 to move together with the second substrate 102 to shorten the focal distance. In an embodiment, the detector 104 may be connected to the bellows pipe 107 to move along the bellows pipe 107 to maintain a constant distance between the moving second substrate 102 and the detector 104.

In an embodiment, a plurality of detectors 104, bellows pipes 107 may be arranged to be connected to the respective detectors 104, and in such an embodiment, it is desired to constantly maintain the focal distances between the plurality of detectors 104 and the second substrate 102.

The support portion 150 is connected to the vacuum chamber 103 and an end portion of the bar 180 that is disposed above and extends along, e.g., in a horizontal direction, the upper portion of the vacuum chamber 103, while being spaced apart from the vacuum chamber 103, and supports the bar 180 and the vacuum chamber 103 to maintain relative positions thereof with respect to each other. The support portion 150 may include or be made of a material that is hard and dense, e.g., having high strength or hardness, to support the weight of the bar 180 that extends in the horizontal direction.

The bar 180 may extend in the horizontal direction along the vacuum chamber 103 and be disposed on the upper portion of the vacuum chamber 103. The rail 182 is arranged on, e.g., attached to, the bar 180, and the rail 182 connects the pickup 110 to the bar 180, such that the rail on the bar 180 guides the movement of the pickup 110. In an embodiment, the moving motor 116 may be further attached between the pickup 110 and the rail 182, the moving motor 116 may provide a power to the pickup 110 to allow the pickup 110 to move or rotate. The moving motor 116 provides a power to the detector 104 so that the detector 104 may move along the rail 182. The moving motor 116 may provide a power to move the detector 104 along the rail 182, to rotate the detector 103 at a predetermined position, and to move the detector 104 in the vertical direction in the vacuum chamber 103.

Figure 18:
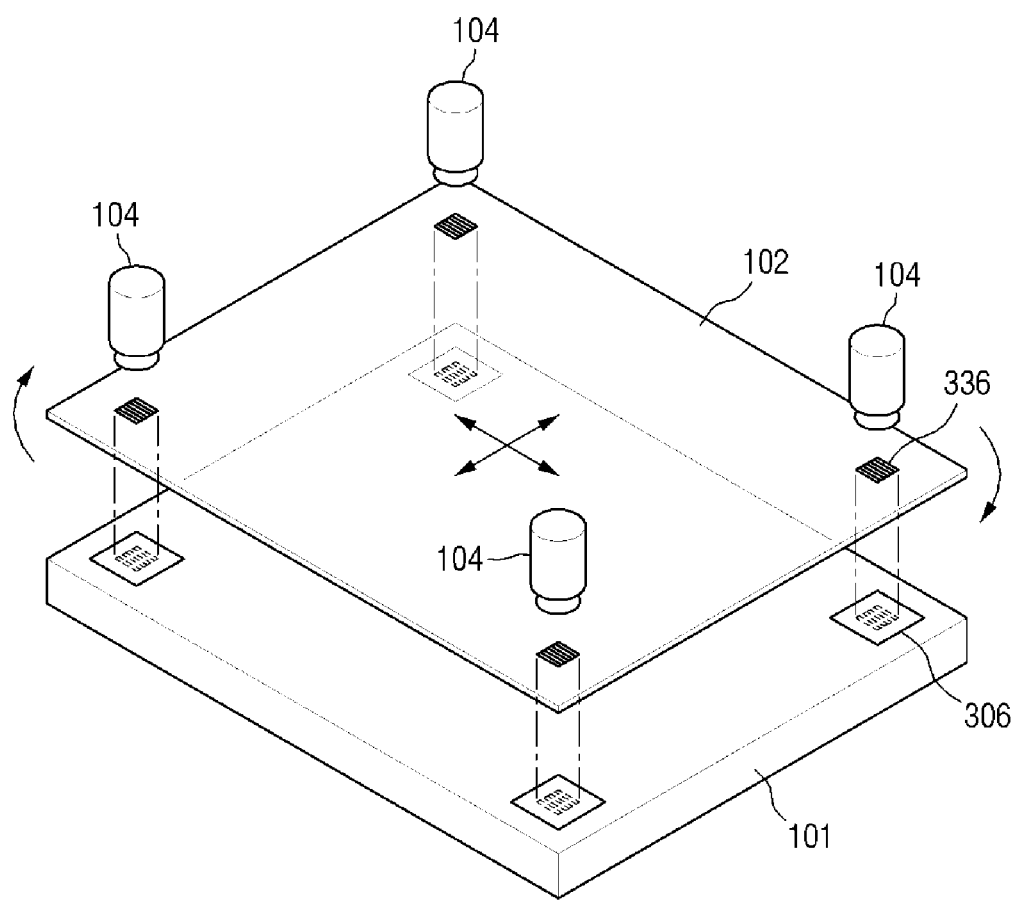
FIGS. 18 to 20 are views showing a method for aligning a display panel according to some embodiments of the invention.
Figure 19:
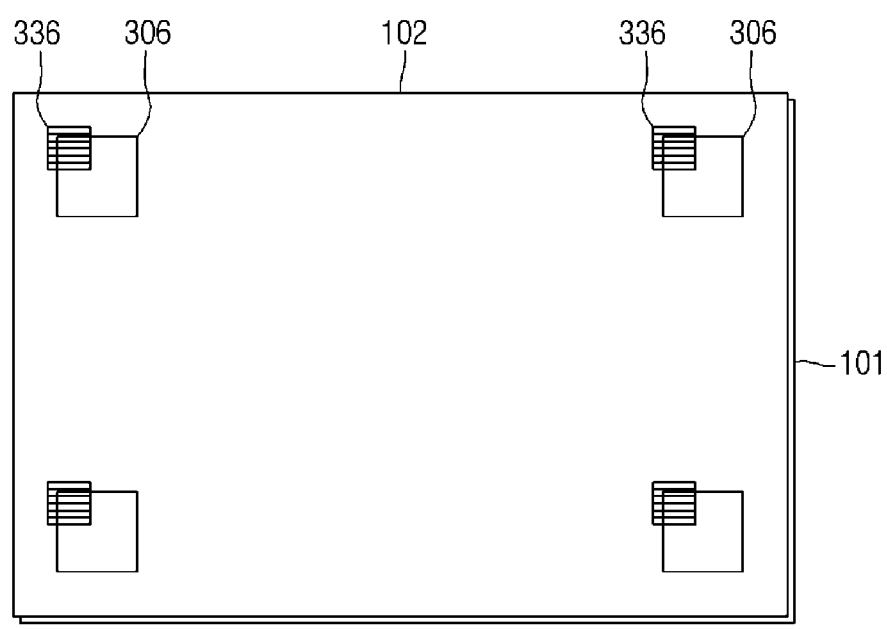
Figure 20:
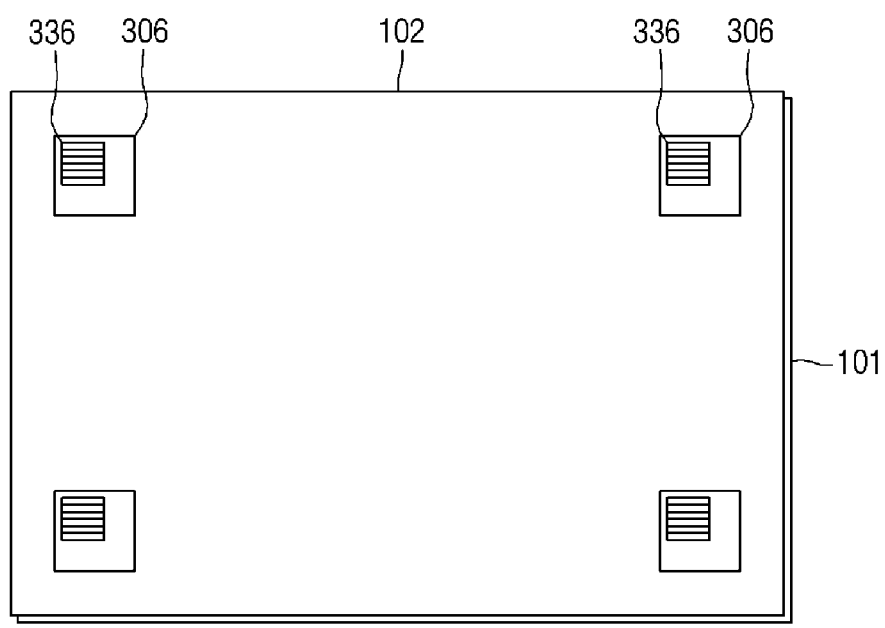

FIGS. 18 to 20 are views showing are views showing a method for aligning a display panel according to some embodiments of the invention. More particularly, FIGS. 18 to 20 shows a method of operating the detector 104 to recognize and align the second alignment key 336 of the second substrate 102 and the first alignment key 306 of the first substrate 101.

In an embodiment, the detector 104 is positioned on an upper portion of the second substrate 102 on which the second alignment key 336 is arranged. The detector 104 determines whether the second alignment key 336 of the second substrate 102 enters into the region of the first alignment key 306 of the first substrate 101 to determine whether the two substrates 102 and 101 are aligned.

Referring to FIG. 19, in the case where the second alignment key 336 of the second substrate 102 lies on the first alignment key 306 of the first substrate 101 or is positioned on the outside of the first alignment key 306 of the first substrate 101, the detector 104 determines that the second substrate 102 and the first substrate 101 are not aligned, and makes the pickup 110 move the second substrate 102.

Referring to FIG. 20, in a case where the second alignment key 336 of the second substrate 102 is positioned in the region of the first alignment key 306 of the first substrate 101, the detector 104 determines that the two substrates 102 and 101 are aligned when the states of the second alignment key 336 of the second substrate 102 and the first alignment key 306 of the first substrate 101 are sensed. In an embodiment, the portion of the second alignment key 336 that overlaps the first alignment key 306 and the portion of the second alignment key 336 that does not overlap the first alignment key 306 may not symmetrical to each other, and thus the center of the second alignment key 336 and the center of the first alignment key 306 do not coincide with each other to be asymmetrical to each other.

If it is recognized that the second substrate 102 and the first substrate 101 are aligned, the detector 104 may make the second substrate 102 vertically descend toward the first substrate 101 to come in contact with the first substrate 101. In such an embodiment, the detector 104 may vertically descend together with the second substrate 102 to maintain resolution and to maintain the focal distance from the second substrate 102.

As illustrated in FIG. 15, once the second alignment key 336 of the second substrate 102 enters into the region of the first alignment key 306 of the first substrate 101, the detector 104 may recognize that the two substrates are aligned. The size of the first alignment key 306 of the first substrate 101 may be larger than the size of the second alignment key 336 of the second substrate 102, and even in the case where the second alignment key 336 of the second substrate 102 enters into the bonding mark of the first substrate 101, the first alignment key 306 of the first substrate 101 may have a free space. The free space may be designed in consideration of an error range that may be allowed during alignment of the second substrate 102 and the first substrate 101.

Since the second substrate 102 may include or be made of a transparent material and floats in the air within the bonding device, it may be difficult to recognize the second alignment key 336 of the second substrate 102. Accordingly, by making the second alignment key 336 of the second substrate 102 with a transparent material and forming the groove therein, the detector 104 may effectively recognize the second alignment key 336 through distortion of the light direction.

Figure 21:
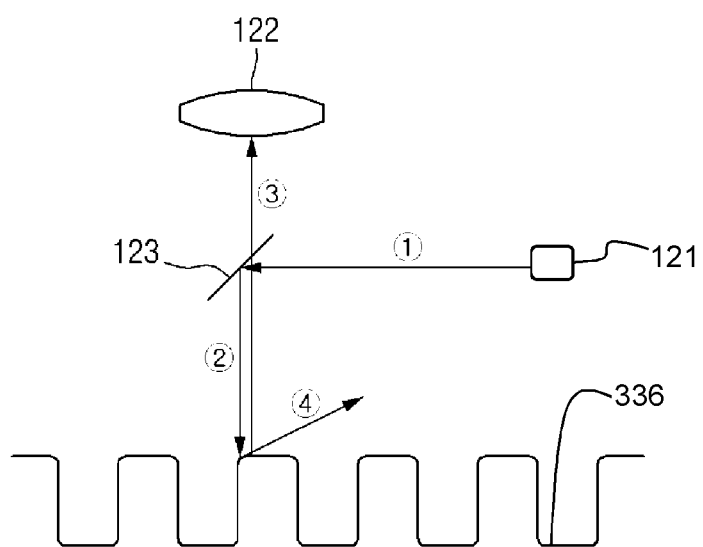
FIG. 21 is a view showing a method for a bonding device to recognize an alignment key according to an embodiment of the invention.

FIG. 21 is a view showing a method for the detector 104 to recognize the groove of the second substrate 102 according to an embodiment of the invention. The detector 104 may include a measurement portion 122, a light source 121, and a splitter 123.

The direction of the light (①) that is emitted from the light source 121 may be partially changed by the splitter 123 (②). The light (②) that is directed to the second alignment key 336 of the second substrate 102 is reflected by the second alignment key 336. Due to a difference between the light (②) and not only the light (③) that is reflected from the second alignment key 336 but also the light (④) that is lost by the groove on the second alignment key 336, the detector 104 may recognize the second alignment key 336.

Although some embodiments of the invention have been described for illustrative purposes, those skilled in the art will appreciate that various modifications, additions and substitutions are possible, without departing from the scope and spirit of the invention as disclosed in the accompanying claims.

What is claimed is:

1. A display panel comprising:
a first substrate;
a second substrate disposed opposite to the first substrate;
a sealing key disposed on the second substrate; and
a sealing member disposed between the first substrate and the second substrate to at least partly overlap the sealing key,
wherein the sealing key comprises a border portion and a groove pattern disposed in a region defined by the border portion,
wherein a region defined by the border portion including the groove pattern of the sealing key includes a portion that overlaps the sealing member and a portion that does not overlap the sealing member when viewed from a plan view in a thickness direction,
a plurality of pixels disposed on a display region of the first substrate;
a plurality of gate lines connected to the pixels;
a plurality of data lines connected to the pixels and which crosses the gate lines;
a first alignment disposed on an alignment key region of the first substrate, which is arranged on an outside of the sealing key, and
a second alignment key disposed on the second substrate to overlap the first alignment key,
wherein the sealing key is disposed on a non-display region of the first substrate, which is arranged on an outside of the display region to surround the display region.

2. The display panel of claim 1, wherein
the groove pattern of the sealing key comprises a first groove pattern extending in a first direction and a second groove pattern extending in a second direction that vertically crosses the first direction, and
the sealing key includes a cross region on which the first groove pattern and the second groove pattern cross each other.

3. The display panel of claim 2, wherein a thickness of the first groove pattern is different from a thickness of the second groove pattern.

4. The display panel of claim 1, wherein
the groove pattern includes a tapered inner side wall.

5. The display panel of claim 1, wherein
the groove pattern includes a curved boundary surface.

6. The display panel of claim 1, wherein
the groove pattern comprises a plurality of grooves, and
a shortest width of an inside of a groove of the groove pattern is shorter than a shortest gap distance between two adjacent grooves of the groove pattern.

7. The display panel of claim 1, wherein
the groove pattern comprises a plurality of grooves, and
the sealing member at least partly fills an inside of the grooves of the groove pattern.

8. The display panel of claim 1, wherein
the first alignment key comprises a same material as a material of the gate lines and the data lines and is disposed in a same layer as the gate lines and the data lines.

9. The display panel of claim 1, wherein
a groove of the groove pattern of the second alignment key comprises a bottom surface in the groove pattern and an inner side wall extending from the bottom surface to an upper surface of the groove pattern, and
at least one of the bottom surface and the inner side wall comprises an uneven surface.

* * * * *